US008519281B2

(12) United States Patent
Mizushima

(10) Patent No.: US 8,519,281 B2
(45) Date of Patent: Aug. 27, 2013

(54) INPUT DEVICE

(76) Inventor: Masanori Mizushima, Takaoka (JP)

( * ) Notice: Subject to any disclaimer, the term of this patent is extended or adjusted under 35 U.S.C. 154(b) by 70 days.

(21) Appl. No.: 13/031,987

(22) Filed: Feb. 22, 2011

(65) Prior Publication Data

US 2011/0139517 A1 Jun. 16, 2011

Related U.S. Application Data

(63) Continuation of application No. PCT/JP2009/063550, filed on Jul. 30, 2009.

(30) Foreign Application Priority Data

Sep. 3, 2008 (JP) .................................. 2008-225955

(51) Int. Cl.
*G06F 3/044* (2006.01)
*H03K 17/975* (2006.01)

(52) U.S. Cl.
USPC ........................................ 178/18.06; 200/600

(58) Field of Classification Search
USPC ............... 178/18.06; 345/173–183; 200/600
See application file for complete search history.

(56) References Cited

U.S. PATENT DOCUMENTS

| 4,986,136 A * | 1/1991 | Brunner et al. .......... 73/862.046 |
| 5,801,313 A * | 9/1998 | Horibata et al. ................ 73/718 |
| 6,145,384 A * | 11/2000 | Ikeda et al. ...................... 73/780 |
| 6,373,265 B1 * | 4/2002 | Morimoto et al. ............ 324/686 |
| 6,989,677 B2 * | 1/2006 | Morimoto ...................... 324/660 |
| 2003/0030452 A1 | 2/2003 | Okada et al. |
| 2005/0052425 A1 | 3/2005 | Zadesky et al. |
| 2005/0144794 A1 * | 7/2005 | Ueno et al. ................. 33/366.19 |
| 2005/0252303 A1 * | 11/2005 | Taniguchi ....................... 73/780 |
| 2007/0180924 A1 * | 8/2007 | Warren et al. .................... 73/780 |
| 2010/0193341 A1 * | 8/2010 | Uotani .......................... 200/5 A |

FOREIGN PATENT DOCUMENTS

| JP | 11-132872 A1 | 5/1999 |
| JP | 2001-324397 A1 | 11/2001 |
| JP | 2003-131786 A1 | 5/2003 |
| JP | 2005-038623 A1 | 2/2005 |
| JP | 2007-503052 A1 | 2/2007 |

* cited by examiner

*Primary Examiner* — Dorothy Harris
(74) *Attorney, Agent, or Firm* — Burr & Brown

(57) ABSTRACT

An input device includes a thin film substrate on which a fixed electrode is formed, and a movable electrode formed of a conductive material, the fixed electrode including a capacitance detection electrode and a connection section, the movable electrode including a displacement section that is disposed to be opposite to the capacitance detection electrode and deformed by a pressing force, and a stationary section that is connected to the connection section, the input device detecting a change in capacitance that occurs when the displacement section has been pressed. The input device has a reduced thickness, and can be inexpensively produced by reducing the number of parts. Moreover, the input device can be easily incorporated in an electronic instrument.

5 Claims, 14 Drawing Sheets

INPUT DEVICE

CROSS REFERENCE TO RELATED APPLICATION

This application is a continuation of International Patent Application No. PCT/JP2009/063550, having an international filing date of Jul. 30, 2009, which designated the United States, the entirety of which is incorporated herein by reference. Japanese Patent Application. No. 2008 225955 filed on Sep. 3, 2008 is also incorporated herein by reference in its entirety.

BACKGROUND OF THE INVENTION

1. Field of the Invention

The present invention relates to an input device that is incorporated in an electronic instrument. More specifically, the invention relates to an input device that detects at least one of the pressing direction and the pressing force based on a change in capacitance when an arbitrary position of the input device has been pressed.

2. Description of Related Art

A capacitance force sensor that allows a two-axis or three-axis input operation has been known as an input device that is incorporated in an electronic instrument (see JP-A-2005-38623, for example).

Such a sensor includes a printed circuit board that includes a base (e.g., glass epoxy) and provided with fixed electrodes, a movable electrode that is formed of a conductive rubber and spaced apart from the fixed electrodes to be opposite to the fixed electrodes, and a metal or resin casing that secures the printed circuit board and the movable electrode.

The fixed electrodes include four fan-shaped electrodes that are disposed concentrically with respect to the center of the sensor. Two electrodes disposed along the X-axis are, used as direction Y input detection electrodes, and two electrodes disposed along the Y axis are used as direction Y input detection electrodes. A Z-axis direction input detection electrode is disposed on the inner circumferential side or the outer circumferential side of the four electrodes.

A change in capacitance that occurs when an arbitrary position of the movable electrode has been pressed can be detected using these electrodes.

However, since many parts are required to form the capacitance force sensor, the cost of the capacitance force sensor increases.

It is difficult to reduce the total thickness of the capacitance force sensor since a reduction in thickness of each part (material) is limited. This makes it difficult to incorporate the capacitance force sensor in a thin electronic instrument.

Moreover, the capacitance force sensor has a large two-dimensional area, and may interfere with other parts (e.g., switch). Therefore, the capacitance force sensor has not been widely incorporated in an electronic instrument.

An input device that includes a plurality of fan-shaped electrodes that are disposed concentrically, and detects a change in capacitance that occurs when the electrodes are traced with a finger or the like. (see JP-T-2007-503052, for example).

This device can detect whether the user has traced the detection section clockwise or counterclockwise when the user has circularly traced the detection section with a finger, and has been applied to a volume operation or a scroll operation of a portable audio instrument.

The above input device can detect a simple two-dimensional input operation (e.g., scroll operation), but cannot detect the pressing force due to the detection principle.

SUMMARY OF THE INVENTION

The present invention provides a capacitance change detection input device that has a reduced thickness, and can be inexpensively produced by reducing the number of parts.

The input device should be easily incorporated in an electronic instrument with an improved degree of freedom.

The invention implements a capacitance change detection input device that is inexpensive and has a reduced thickness by forming the input device mainly using a thin resin film substrate on which a fixed electrode is formed, and a movable electrode formed of a conductive material.

More specifically, the input device according to the invention includes a thin film substrate on which a fixed electrode is formed, and a movable electrode formed of a conductive material, the fixed electrode including a capacitance detection electrode and a connection section, the movable electrode including a displacement section that is disposed to be opposite to the capacitance detection electrode and deformed by a pressing force, and a stationary section that is connected to the connection section of the fixed electrode, the input device detecting a change in capacitance that occurs when the displacement section has been pressed.

If the capacitance detection section includes a pressing force detection capacitance detection electrode that is disposed concentrically with respect to the center of the capacitance detection section, the overlapping area of the movable electrode and the fixed electrode in the capacitance detection section changes depending on the pressing force, so that the input/output signal can be changed. The input device can thus be provided with the function of an analog input/output sensor.

A plurality of pressing force detection electrodes may be formed concentrically.

This improves the pressing force detection resolution.

If the capacitance detection section includes a plurality of capacitance detection electrodes for detecting X-axis and Y-axis pressing directions that are disposed in a circumferential direction with respect to the center of the capacitance detection section, a two-direction input/output function based on the crosswise pressing direction of an input button can be implemented, for example.

This means that the detection can be detected based on vector synthesis of two direction components (e.g., an X-axis and a Y-axis that perpendicularly intersects the X-axis), for example.

Therefore, the resolution is improved by increasing the number of electrodes arranged in the circumferential direction.

The features of the capacitance detection section disposed concentrically and circumferentially may be individually employed. An input device that can detect the pressing force and the pressing direction is obtained by combining both features.

The displacement section of the movable electrode may include a plurality of protrusion sections that protrude toward the capacitance detection electrode, the plurality of protrusion sections may have a concentric ring shape with respect in the center of the capacitance detection section, or may be divided in the circumferential direction to have a hemispherical or conical shape, the movable electrode may include a center stationary section, and the displacement section disposed around the center stationary section, and a distance between an end of a protrusion section among the plurality of protrusion sections and the capacitance detections electrode may sequentially increase toward a periphery of the input device.

According to this configuration, the operation feel and the capacitance detection sensitivity of the input device can be optimized.

The input device can be easily mounted on an electronic instrument board by providing a thin adhesive layer on the back surface of the input device. If a double-sided tape that is partially formed of a conductive material is used as the adhesive layer, electrical noise from the electronic instrument board can be blocked.

A hole may be formed at an arbitrary position of the input device in order to provide the input device with an input function that detects the pressing direction and the pressing force without impairing the function of a switch or the like mounted on the electronic instrument board.

The capacitance input device according to the invention can be significantly reduced in thickness, and can reduce the material/production cost.

The input device can be incorporated in an electronic instrument without impairing the production process by providing a thin adhesive layer on the back surface of the input device. This facilitates the mounting process, and reduces the cost of the entire product.

Moreover, the input device can be provided with an input function that detects the pressing direction and the pressing force without impairing the function of a functional component mounted on an electronic instrument board by forming a hole at an arbitrary position of the input device.

DETAILED DESCRIPTION OF THE INVENTION

Exemplary embodiments of the input device according to the invention are described in detail below with reference to the drawings.

Note that the surface of the thin rosin film substrate on which the movable electrode is secured is referred to as "front surface", and the surface of the thin resin film substrate on which the movable electrode is not secured is referred to as "back surface".

First Embodiment

Figure 1:
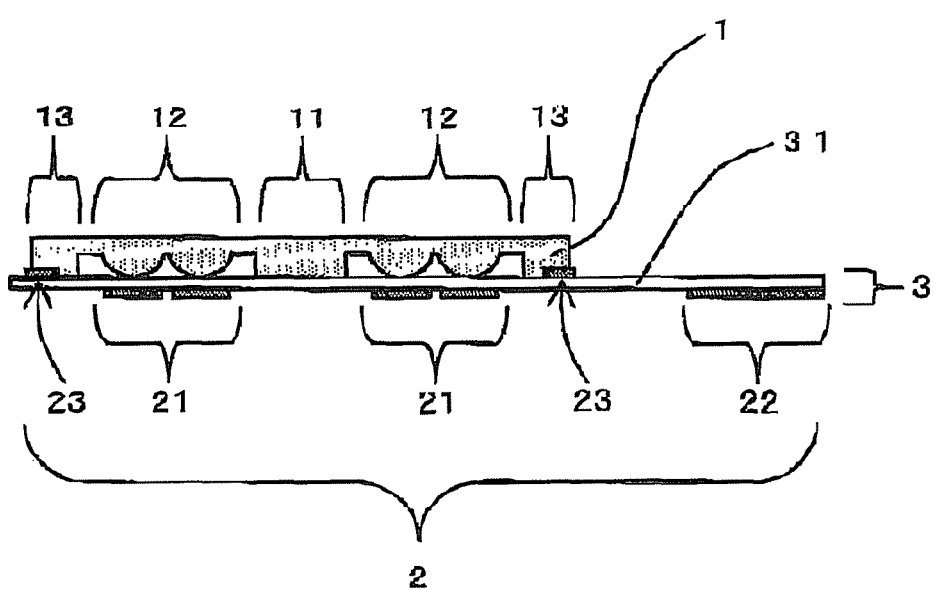
FIG. 1 is a cross-sectional view showing an input device according to a first embodiment of the invention.
Figure 2:
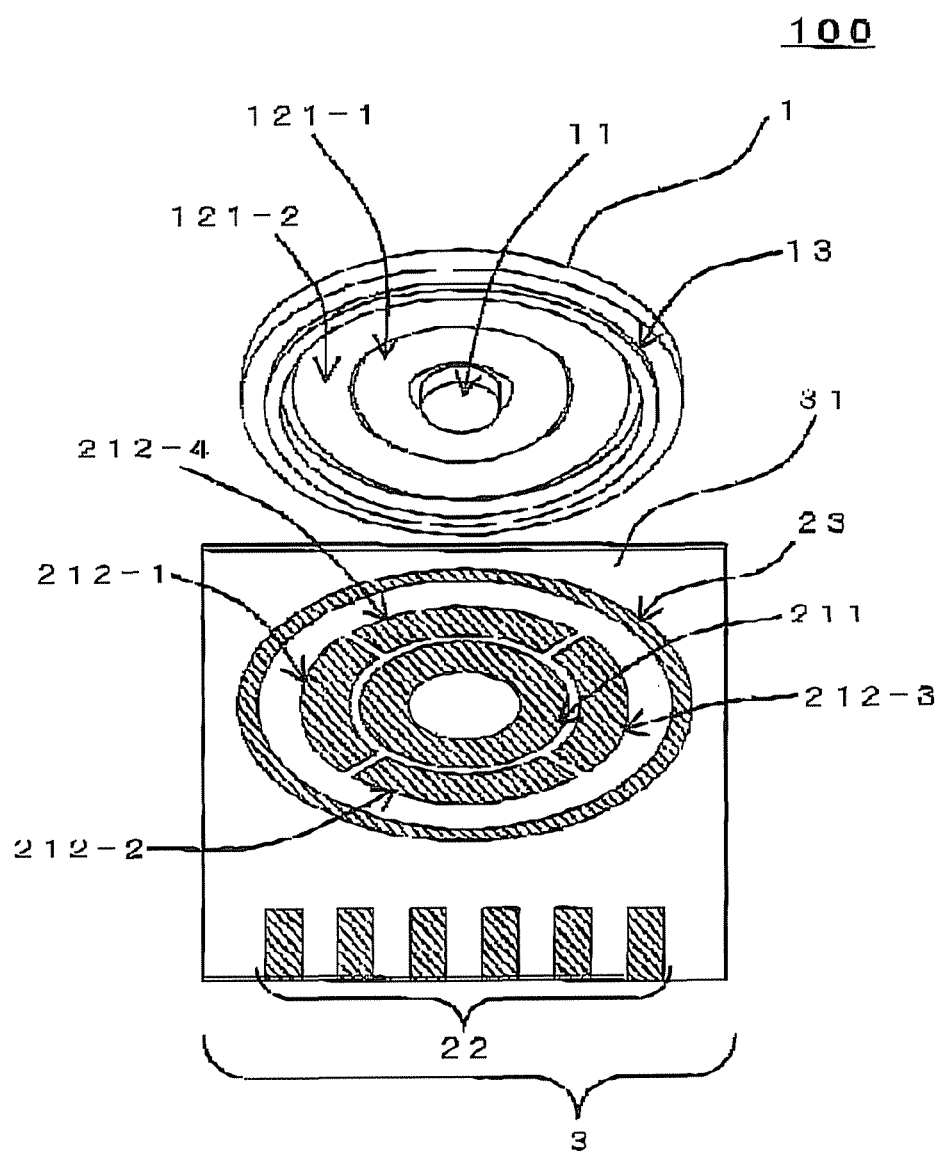
FIG. 2 is an exploded view showing an input device according to the first embodiment of the invention.

FIGS. 1 and 2 illustrate an input device 100 according to a first embodiment of the invention. The input device 100 includes a movable electrode 1 formed of a conductive material, a fixed electrode 2, and a thin resin film substrate 3, the movable electrode 1 and the fixed electrode 2 being disposed on the thin resin film substrate 3.

The movable electrode 1 shown in FIGS. 1 and 2 is formed using a conductive rubber.

The movable electrode 1 includes a center stationary section 11, a displacement section 12, and a peripheral stationary section 13.

The center stationary section 11 and the peripheral stationary section 13 are bonded to the thin resin film substrate 3 using an adhesive that has almost no thickness after being cured.

Part of the peripheral stationary section 13 comes in contact with a connection section 23 that is part of the fixed electrode 2 formed on the thin resin film substrate 3.

An adhesive must not adhere to the connection section 23 so that the movable electrode 1 and the connection section 23 are reliably connected electrically.

The displacement section 12 includes a capacitance detection protrusion section 121-1 and a capacitance detection protrusion section 121-2. The displacement section 12 is easily deformed when an arbitrary position of the movable electrode 1 has been pressed.

The capacitance detection protrusion section 121-1 is disposed to face a capacitance detection electrode 211, and the capacitance detection protrusion section 121-2 is disposed to face capacitance detection electrodes 212-1 to 212-4.

The movable electrode 1 having the above configuration can be produced so that the center stationary section 11 having the maximum thickness has a thickness of about 0.3 to 1 mm.

The fixed electrode 2 includes a plurality of silver electrodes formed on the thin resin film base 31 by screen printing.

The fixed electrode 2 includes a capacitance detection section 21, a lead wire section 22, and the connection section 23 that is electrically connected to the movable electrode 1.

A plurality of capacitance detection sections 21 are formed concentrically.

The innermost ring-shaped capacitance detection electrode 211 detects pressing force.

The capacitance detection electrodes 212-1 to 212-4 are disposed around the capacitance detection electrode 211 at a given interval in the circumferential direction. The capacitance detection electrodes 212-1 to 212-4 detect a pressing direction (X-axis direction, Y-axis direction, and synthesized vector).

The capacitance detection electrodes 212-1 to 212-4 are connected to electrodes of the lead wire section 22.

The lead wire section 22 is electrically connected to a substrate mounted with the input device.

The capacitance detection sections 212, 212-1 to 212-4 and the lead wire section 22 are formed and connected on the back surface of the thin resin film base 31. The connection section 23 is formed on the front surface of the thin resin film base 31 that opposes the movable electrode 1 and is connected to the lead wire section 22 by embedding a conductive material in a hole formed in the thin resin film base 31, for example.

The fixed electrode 2 may be formed using copper deposited by sputtering or the like, or may be formed by patterning an aluminum thin film.

The thin resin film base 31 functions as an insulating layer for the movable electrode 1 and the capacitance detection section 21, and also functions as a base (support).

It is desirable that the thin resin film base 31 be as thin as possible in order to improve the detection sensitivity of the input device 100. On the other hand, the thin resin filet substrate 31 must have such a strength that the thin resin film substrate 31 is maintained flat.

Therefore, the thickness of the thin resin film base 31 is preferably 25 to 100 μm.

The thin resin film base 31 is formed using polyimide, polyethylene terephthalate (PET), or the like.

The input device 100 that includes the movable electrode 1, the fixed electrode 2, and the thin resin film substrate 3 can be formed to a very small thickness (minimum thickness: about 0.325 mm).

Figure 3:
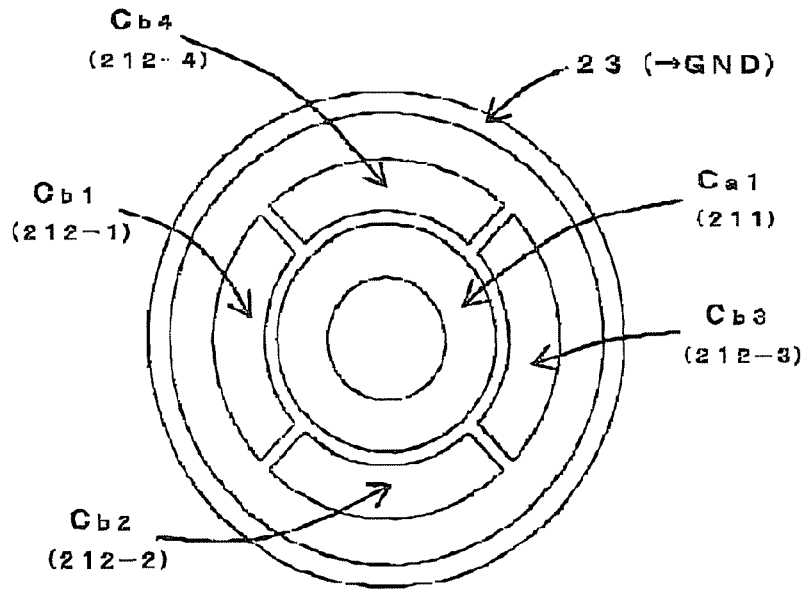
FIG. 3 is a view showing a capacitance and a capacitance detection section of an input device according to the first embodiment of the invention.

FIG. 3 shows the capacitance detection section 21 and the connection section 23.

A capacitance $C_{a1}$ is formed by the electrode 211 of the capacitance detection section 21 and the protrusion section 121-1.

Capacitances $C_{b1}$ to $C_{b4}$ are respectively formed by the electrodes 212-1 to 212-4 and the protrusion section 121-2.

The effects of the input device 100 having the above configuration are described below.

Figure 4:
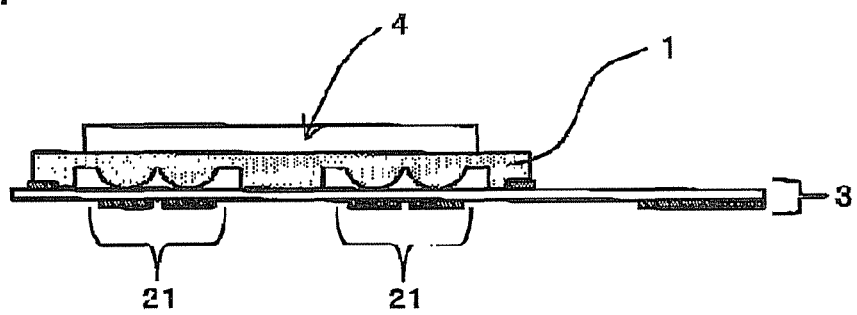
FIG. 4 is a cross-sectional view showing an operation example of an input device according to the first embodiment of the invention.

FIG. 4 shows a state in which the input device 100 is not pressed.

A resin disk 4 is secured on (bonded to) the input device 100.

The outer diameter of the disk 4 is set to be slightly smaller than the inner diameter of the peripheral stationary section 13 of the movable electrode 1 so that the displacement section 12 can be efficiently moved.

Note that the disk 4 imitates a button of an electronic instrument mounted with the input device 100.

Figure 5:
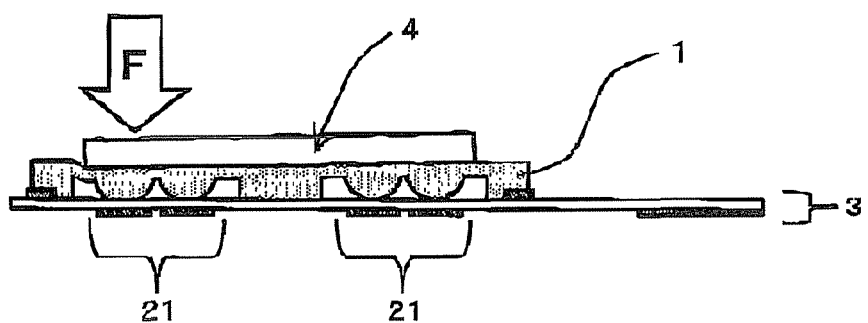
FIG. 5 is a cross-sectional view showing an operation example of an input device according to the first embodiment of the invention.

When an arbitrary position of the disk 4 has been pressed, the movable electrode 1 is deformed due to a force F (FIG. 5).

The displacement section 12 of the movable electrode 1 is crushed, so that the distance from each electrode of the capacitance detection section 21 and the electrode overlapping area (minimum electrode-to-electrode distance: thin resin film base 31) change, and the capacitances $C_{a1}$ and $C_{b1}$ to $C_{b4}$ change.

The capacitances $C_{b1}$ to $C_{b4}$ are used to detect the pressing direction, and the capacitance $C_{a1}$ is used to detect the pressing force. Therefore, output signals representing the pressing direction and the pressing force are obtained from the changes in capacitance.

Since the protrusion sections 121-1 and 121-2 protrude toward the thin resin film substrate 3, the protrusion sections 121-1 and 121-2 function as a cushion when the disk 4 has been pressed, so that a soft stroke is obtained.

Figure 6:
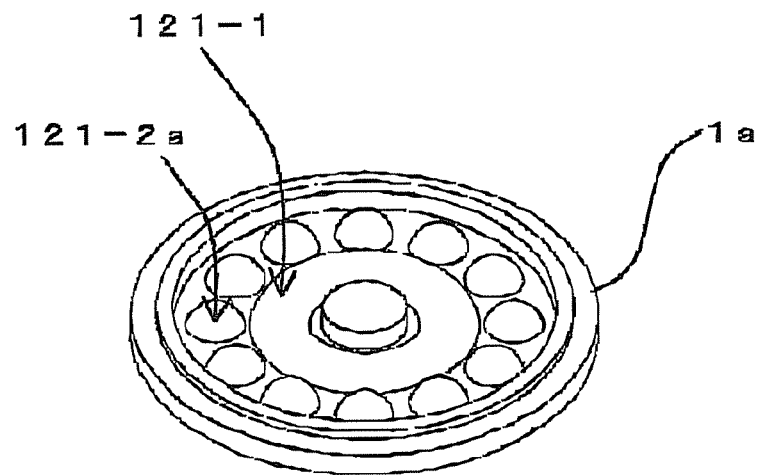
FIG. 6 is a perspective view showing an example of the shape of a movable electrode of an input device according to the first embodiment of the invention.

When it is desired to obtain a softer stroke, and increase a change in capacitance, it is possible to use a movable electrode 1a that includes protrusion sections 121-2a shown in FIG. 6 (i.e., the displacement section 12 is divided).

Figure 7:
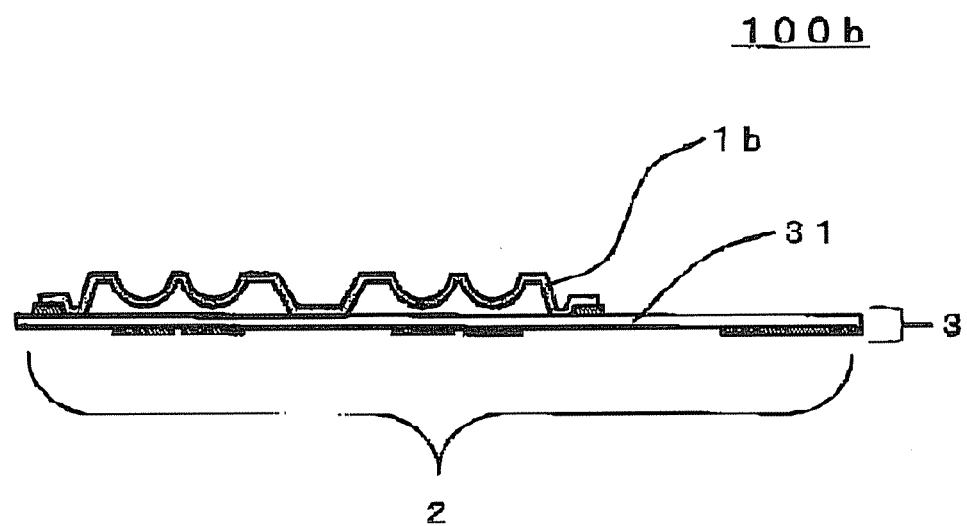
FIG. 7 is a cross sectional view showing an input device according to the first embodiment of the invention when using a movable electrode made of stainless steel.

When using a thin stainless steel sheet as the conductive material for the movable electrode, it is preferable to use a movable electrode 1b shown in FIG. 7.

The thickness of the thin stainless steel sheet is preferably about 50 to 150 μm in order to obtain a soft operation feel and excellent durability.

Figure 8:
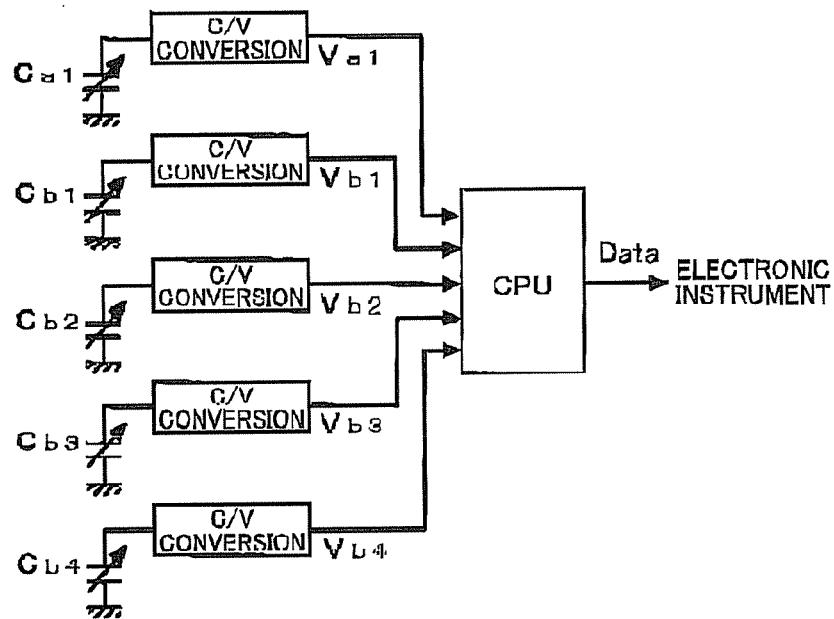
FIG. 8 is a view showing a detection circuit of an input device according to the first embodiment of the invention.

When forming a circuit shown in FIG. 8, and applying a voltage that changes periodically to the capacitances $C_{a1}$ and $C_{b1}$ to $C_{b4}$, signals $V_{a1}$ and $V_{b1}$ to $V_{b4}$ are obtained depending on the capacitances.

When no load is applied, the signals $V_{a1}$ and $V_{b1}$ to $V_{b4}$ have an identical value.

When an arbitrary position of the disk 4 secured on the input device has been pressed, the capacitances $C_{a1}$ and $C_{b1}$ to $C_{b4}$ change depending on the pressing direction and the pressing force, so that voltage change amounts $dV_{a1}$ and $dV_{b1}$ to $dV_{b4}$ with respect to a no load state are obtained.

The voltage change amounts $dV_{a1}$ and $dV_{b1}$ to $dV_{b4}$ are processed by a central processing unit (CPU), and the pressing direction and the pressing force applied to the input device 100 are output to the electronic instrument.

Second Embodiment

Figure 9:
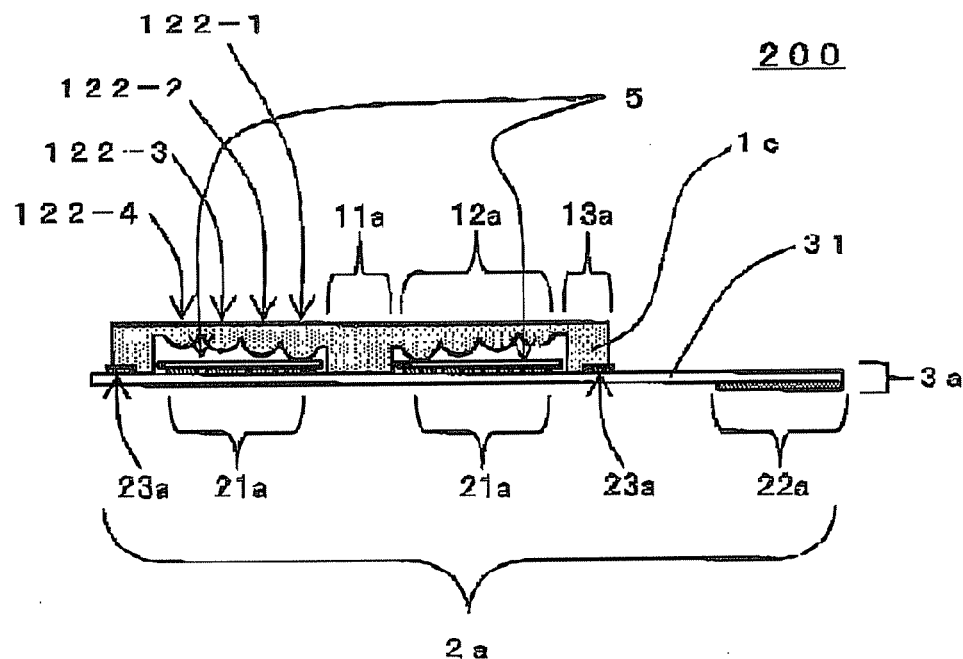
FIG. 9 is a cross-sectional view showing an input device according to a second embodiment of the invention.
Figure 10:
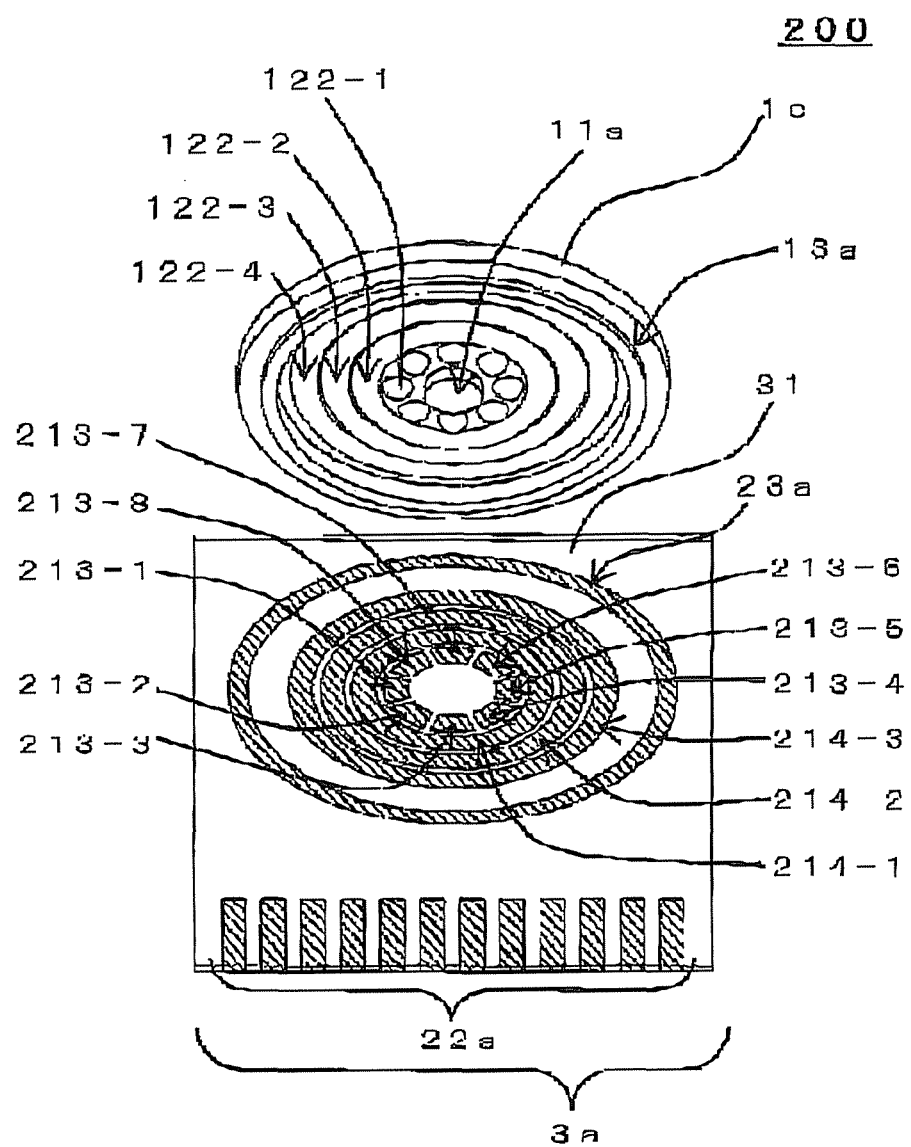
FIG. 10 is an exploded view showing an input device according to the second embodiment of the invention.

FIGS. 9 and 10 illustrate an input device 200 according to a second embodiment of the invention. In FIGS. 9 and 10, sections that respectively correspond to the sections shown in FIGS. 1 and 2 are indicated by identical symbols.

A plurality of capacitance detection sections 21a of a fixed electrode 2a are concentrically formed on the front surface of thin film substrate 31 which opposes a movable electrode 1c.

A lead wire section 22a is formed on the back surface of the thin resin film substrate 31 in the same manner as in the input device 100.

Electrodes of the capacitance detection sections 21a and wires of the lead wire section 22a are connected via holes formed in the thin resin film base 31.

Pressing direction detection electrodes 213-1 to 213-8 are disposed on the innermost side of the capacitance detection section 21a at a given interval in the circumferential direction.

Pressing force detection electrodes 214-1 to 214-3 dud are disposed at a given interval in the diametrical direction are formed around the pressing direction detection electrodes 213-1 to 213-8.

The input device 200 includes eight pressing direction detection electrodes, while the input device 100 includes four pressing direction detection electrodes. The pressing direction angular resolution can be improved by doubling the number of pressing direction detection electrodes.

The input device 200 includes three pressing force detection electrodes, while the input device 100 includes one pressing force detection electrode. The pressing force resolution can be improved by tripling the number of pressing force detection electrodes.

A resin tape 5 that includes a base and an adhesive layer is bonded to the capacitance detection section 21a as an insulating layer between the capacitance detection section 21a and the movable electrode 1c.

The base of the resin tape 5 is formed of polyimide or PET, and preferably has a thickness of 25 to 50 μm.

The movable electrode 1c is formed of a conductive rubber. A center stationary section 11a and a peripheral stationary section 13a are bonded to a thin resin film substrate 3a using an adhesive that has almost no thickness after being cured.

As shown in FIG. 9, a displacement section 12a includes protrusion sections 122-1 to 122-4. The protrusion sections 122-1 to 122-4 are formed so that the distance between the end of the protrusion and the thin resin film substrate 3a increases from the center toward the periphery of the thin resin film substrate 3a (i.e., from the protrusion section 122-1 toward the protrusion section 122-4).

If a plurality of protrusion sections are formed in an identical plane, the structure becomes hard, so that the input device does not implement a soft operation feel. On the other hand, it is possible to implement a soft operation feel, and achieve a larger change in capacitance by forming the protrusion sections of the displacement section 12a so that the distance from the thin resin film substrate 3a increases toward the periphery of the thin resin film substrate 3a.

Figure 11:
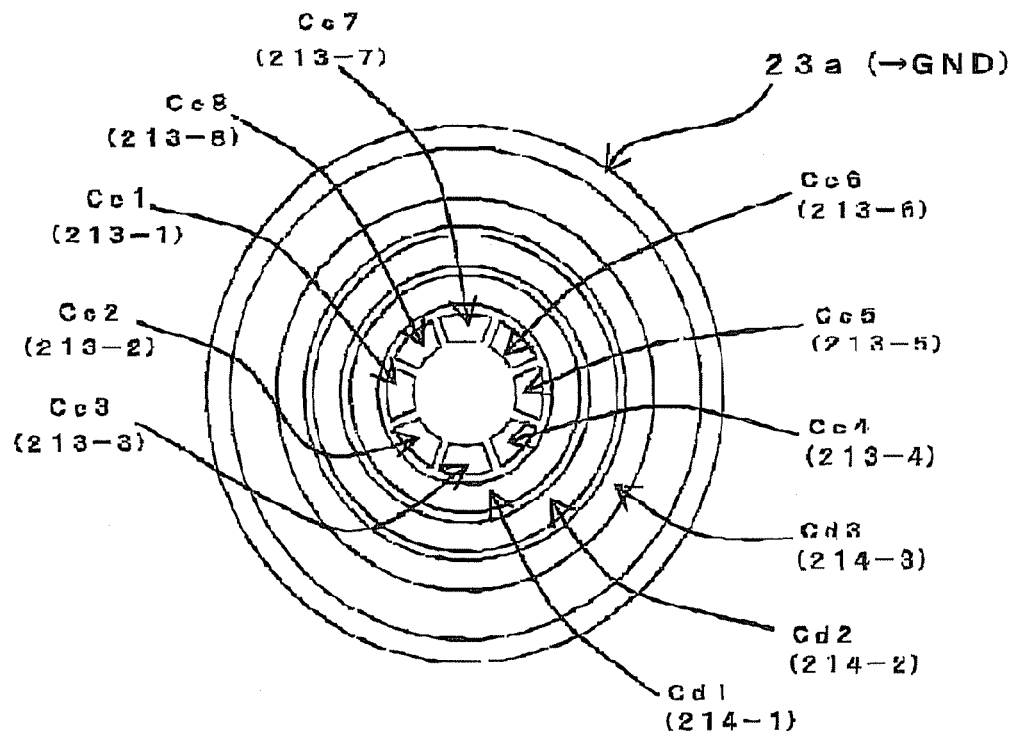
FIG. 11 is a view showing a capacitance and a capacitance detection section of an input device according in the second embodiment of the invention.

FIG. 11 shows the capacitance detection section 21a and the connection section 23a.

Capacitances $C_{c1}$ to $C_{c8}$ are formed by the electrodes 213-1 to 213-8 and the protrusion section 122-1.

Capacitances $C_{d1}$ to $C_{d3}$ are formed by the electrodes 214-1 to 214-3 and the protrusion sections 122-2 to 122-4, respectively.

Figure 12:
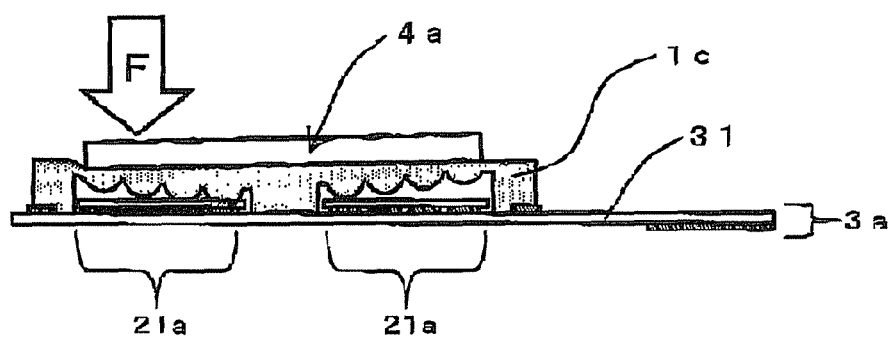
FIG. 12 is a cross-sectional view showing an operation example of an input device according to the second embodiment of the invention.

When an arbitrary position of a disk 4a that is smaller to some extent than the inner diameter of the peripheral stationary section 13a has been pressed, the movable electrode 1c is deformed due to a force F (see FIG. 12).

The displacement section 12a of the movable electrode 1a is crushed, so that the distance and the overlapping area of each electrode of the capacitance detection section 21a change, and the capacitances $C_{c1}$ to $C_{c8}$ and $C_{d1}$ to $C_{d3}$ change.

The capacitances $C_{c1}$ to $C_{c8}$ are used to detect the pressing direction, and the capacitances $C_{d1}$ to $C_{d3}$ are used to detect the pressing force. Therefore, output signals representing the pressing direction and the pressing force are obtained from the changes in capacitance.

Each protrusion section of the displacement section 12a is initially positioned away from the thin resin film substrate 3a. Therefore, the protrusion section is softly deformed to come in contact with the thin rosin film substrate 3a, so that the capacitances $C_{c1}$ to $C_{c8}$ and $C_{d1}$ to $C_{d3}$ change while being constrained by the electrode-to-electrode distance.

After each protrusion section of the displacement section 12a has come in contact with the thin resin film substrate 3a, the capacitances $C_{c1}$ to $C_{c5}$ and $C_{d1}$ to $C_{d3}$ change while being constrained by the electrode overlapping area (minimum electrode-to-electrode distance: resin tape 5).

In the input device 200, the initial distance between the displacement section 12a and the thin resin film substrate 3a can be optimized based on the desired to detection sensitivity and the desired operation feel.

Figure 13:
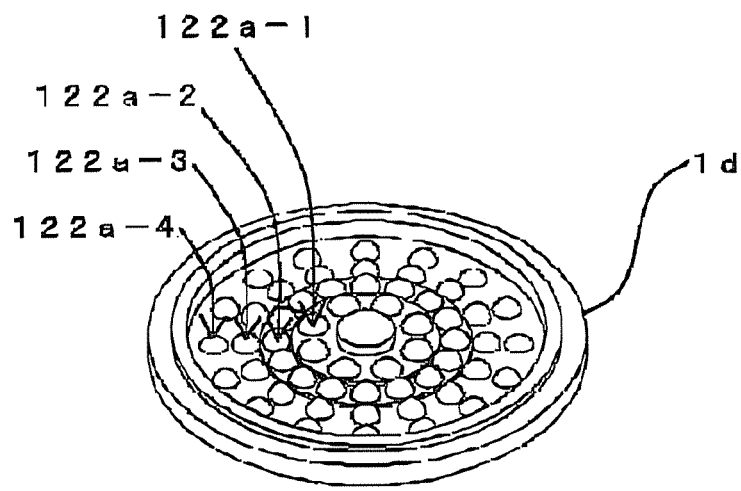
FIG. 13 is a perspective view showing an example of the shape of a movable electrode of an input device according to the second embodiment of the invention.

A softer operation feel is obtained after the movable electrode has come in contact with the thin resin film substrate 3a by utilizing a movable electrode 1d shown in FIG. 13 that includes protrusion sections 122a-1 to 122a-4.

Figure 14:
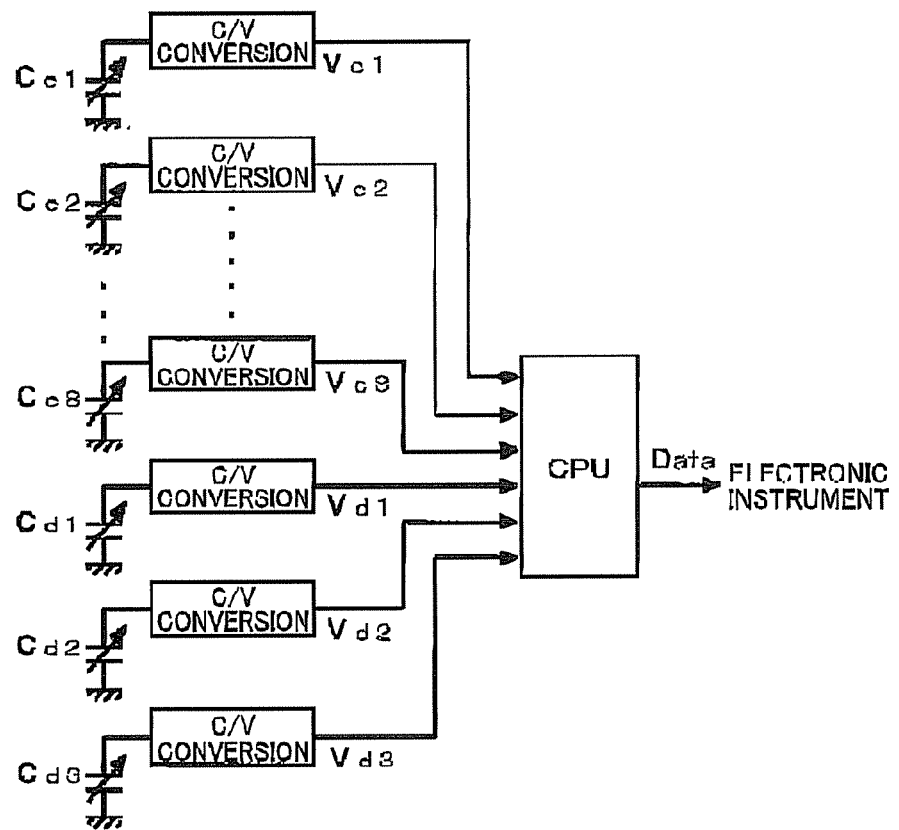
FIG. 14 is a view showing a detection circuit of an input device according to the second embodiment of the invention.

When forming a circuit shown in FIG. 14, and applying a voltage that changes periodically to the capacitances $C_{c1}$ to $C_{c8}$ and $C_{d1}$ to $C_{d3}$, signals $V_{c1}$ to $V_{c8}$ and $V_{d1}$ to $V_{d3}$ are obtained depending on the capacitances.

When no load is applied, the signals $V_{c1}$ to $V_{c8}$ have an identical value.

When an arbitrary position of the disk 4a secured on the input device 200 has been pressed, the capacitances $C_{c1}$ to $C_{c8}$ and $C_{d1}$ to $C_{d3}$ change depending on the pressing direction and the pressing force, so that voltage change amounts $dV_{c1}$ to $dV_{c8}$ and $dV_{d1}$ to $dV_{d3}$ with respect to a no-load state are obtained.

The voltage change amounts $dV_{c1}$ to $dV_{c8}$ and $dV_{d1}$ to $dV_{d3}$ are processed by a CPU, and the pressing direction and the pressing force applied to the input device 200 are output to the electronic instrument.

Third Embodiment

Figure 15:
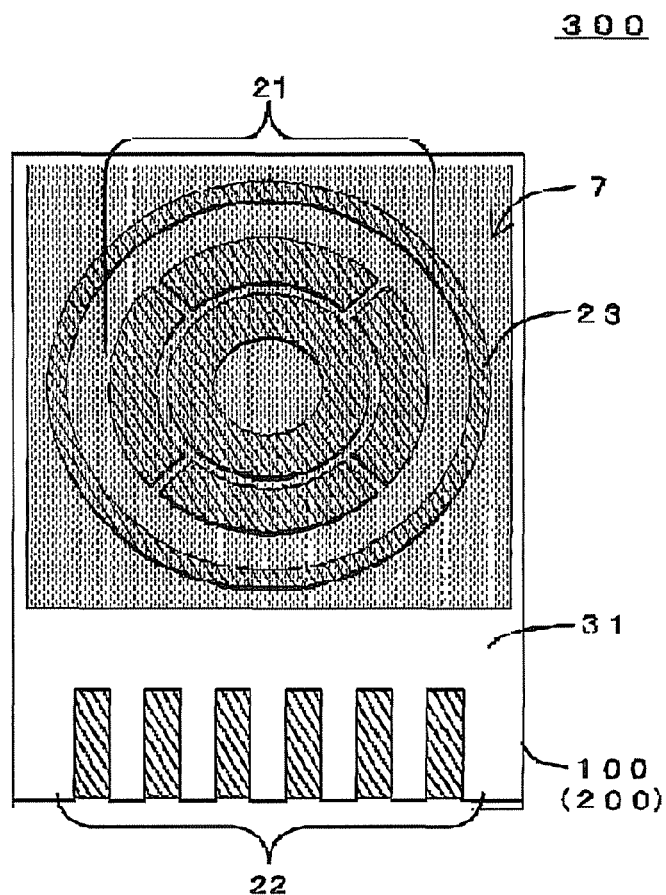
FIG. 15 is a plan view showing an input device according to a third embodiment of the invention.
Figure 16:
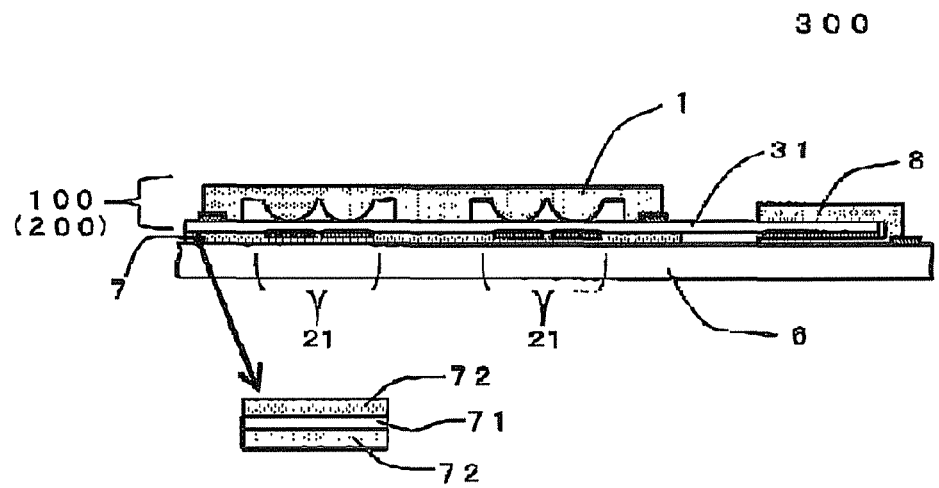
FIG. 16 is a cross-sectional view showing an input device according to the third embodiment of the invention.

FIGS. 15 and 16 illustrate an input device 300 according to a Third embodiment of the invention. In FIGS. 11 and 16, sections that respectively correspond to the sections shown in FIGS. 1 and 2 are indicated by identical symbols.

The input device 300 has a structure in which an insulating double-sided tape 7 is bonded to the back surface of the input device 100 (i.e., on the side of a substrate 6 of an electronic instrument on which the input device 100 is mounted).

In FIG. 16, the input device 300 is connected to the substrate 6 of the electronic instrument via a connector 8. In this case, since it is unnecessary to perform a high-temperature process (e.g., soldering), the input devise 300 can be easily and inexpensively mounted on the substrate 6.

As shown in FIG. 16, the insulating double-sided tape 7 used for the input device 300 includes an insulating base 71 and an insulating adhesive material 72.

It is preferable that the insulating double-sided tape 7 be as thin as possible so that the input device 300 is not displaced relative to the substrate 6 during a pressing operation. The insulating double-sided tape 7 preferably has a thickness of 50 to 200 μm.

The insulating base 71 (insulating layer) must prevent a situation in which each electrode of the capacitance detection section 21 is electrically connected to the wire or electrode on the substrate 6 even if a high load is applied to the input device 300.

Therefore, the thickness of the insulating base 71 is preferably 25 μm or more. The insulating base 71 is preferably formed of a material (e.g., PET film) that has been reliably used for electronic instrument applications. The insulating adhesive material 72 may be formed using a thermoplastic material in order to obtain high adhesion.

A shown in FIG. 15, the insulating double-sided tape 7 is normally bonded to the input device 300 over an area larger than the outer diameter of the connection section 23.

Note that the above effects can be obtained by applying the third embodiment to the input device 200.

Fourth Embodiment

Figure 17:
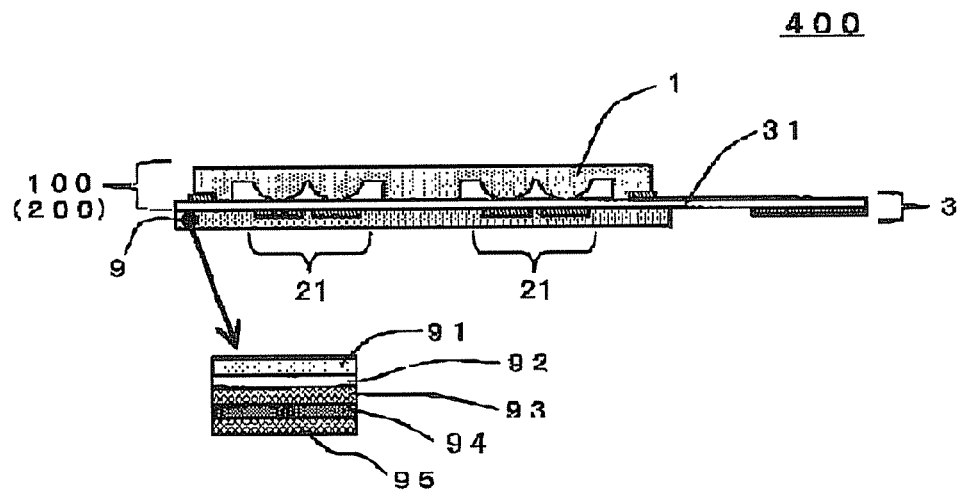
FIG. 17 is a cross-sectional view showing an input device according to a fourth embodiment of the invention.
Figure 18:
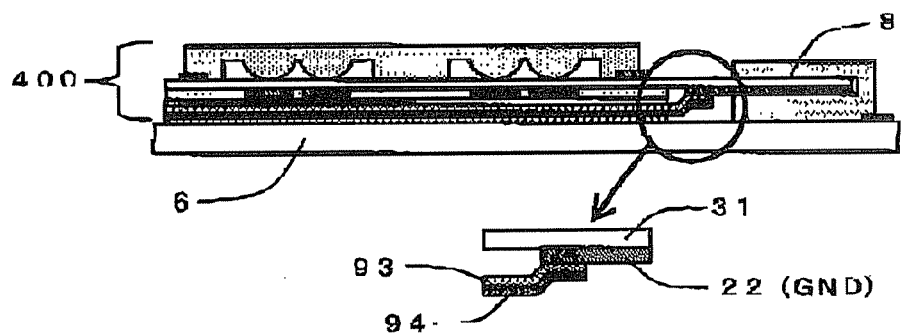
FIG. 18 is a cross-sectional view showing a mounting example of an input device according to the fourth embodiment of the invention.
Figure 19:
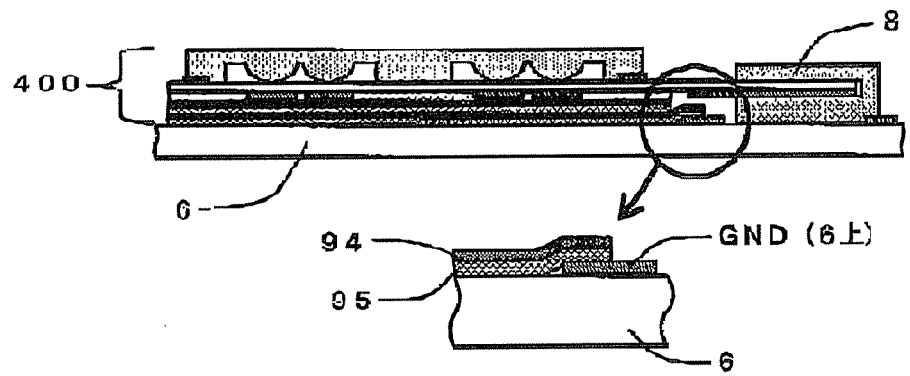
FIG. 19 is a cross-sectional view showing a mounting example of an input device according to the fourth embodiment of the invention.

FIGS. 17, 18, and 19 illustrate an input device 400 according to a fourth embodiment of the invention. In FIGS. 17, 18, and 19, sections that respectively correspond to the sections shown in FIGS. 1 and 2 are indicated by identical symbols.

The input device 400 has a structure in which a double-sided tape 9 including a conductive base is bonded to the back surface of the input device 100 (i.e., on the side of a substrate 6 of au electronic instrument on which the input device 100 is mounted).

This makes it unnecessary to perform a high-temperature process (e.g., soldering) when mounting the input device 400 on the substrate 6. Moreover, electrical noise from the wires formed on the substrate 6 can be blocked by a conductive base 94 included in the double-sided tape 9.

The double-sided tape 9 includes an insulating adhesive material 91, the insulating base 92, an adhesive material 93, a conductive base 94, and an adhesive material 95 in this order from the input device 100.

At least one of the adhesive materials 93 and 95 must be a conductive adhesive material so that the conductive base 94 can be grounded.

As shown in FIG. 18, the adhesive material 93 is grounded when the adhesive material 93 is a conductive adhesive material.

In this case, the adhesive material 95 may be either an insulating adhesive material or a conductive adhesive material.

As shown in FIG. 19, the adhesive material 95 is connected to a ground electrode on the substrate 6 when the adhesive material 95 is a conductive adhesive material.

In this case, the adhesive material 93 may be either an insulating adhesive material or a conductive adhesive material.

Note that the above effects can be obtained by applying the fourth embodiment to the input device 200.

Fifth Embodiment

Figure 20:
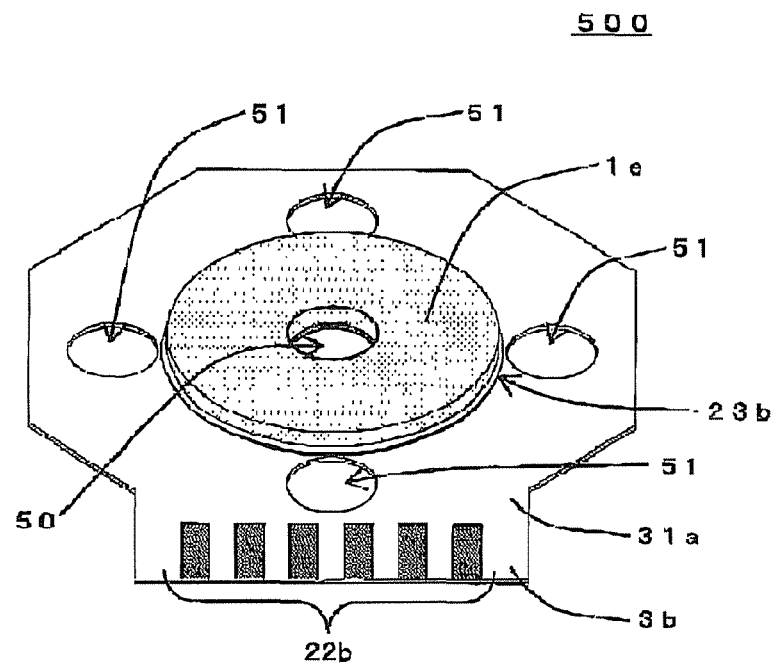
FIG. 20 is a perspective view showing en input device according to a firth embodiment of the invention.
Figure 21:
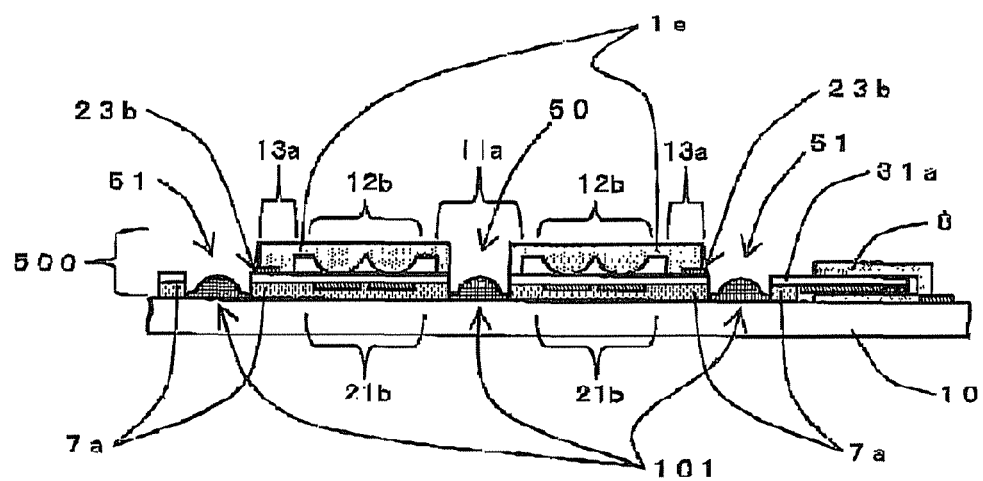
FIG. 21 is a cross-sectional view showing an input device according to the fifth embodiment of the invention.

FIGS. 20 and 21 illustrate an input device 500 according to a fifth embodiment of the invention.

The input device 500 includes a movable electrode 1e, a fixed electrode, and a thin rosin film substrate 3b, the movable electrode 1e and the fixed electrode being formed of a conductive material, and disposed on the thin resin film substrate 3b. Holes 50 and 51 having an arbitrary size are formed in the thin resin film substrate 3b at arbitrary positions at which a capacitance detection function is not affected.

Therefore, even if a functional component 101 (e.g., membrane switch) has been provided at an arbitrary position of a board 10 of an electronic instrument mounted with The input device 500, the functions of the input device 500 can be easily added without affecting the function of the functional component 101.

A center stationary section 11b and a peripheral stationary section 13b of the movable electrode 1c are bonded to the thin resin film substrate 3b using an adhesive that has almost no, thickness after being cured.

A hole having the same diameter as that of the hole 50 is formed in the center area of the thin resin film substrate 3b. The hole 51 that does not interfere with the movable electrode 1c is also formed in the thin resin film substrate 3b.

The electrodes of the capacitance detection section 21b are disposed to avoid the holes 50 and 51 and face protrusion sections 12b of the movable electrode 1e.

The thickness of a thin resin film base 31a used for the thin rosin film substrate 3b is preferably 25 to 100 μm.

The thin resin film base 31a is formed using polyimide, PET, or the like.

The input device 508 has a structure in which a double-sided tape 7a is bonded to the surface of the input device 500 on the side of the capacitance detection section 21b (i.e., on the side of a substrate 10 of the electronic instrument on which the input device 500 is mounted) so that the input device 500 can be easily mounted on the substrate 10.

The double-sided tape 7a may be the insulating double-sided tape 7, or may be the double-sided tape 9 including a conductive base. Holes having the same diameter as that of the holes 50 and 51 formed in the thin resin film substrate 3b are formed in the double-sided tape 7a at positions corresponding to the holes 50 and 51, so that the operation of the functional component 101 is not affected.

Sixth Embodiment

Figure 22A:
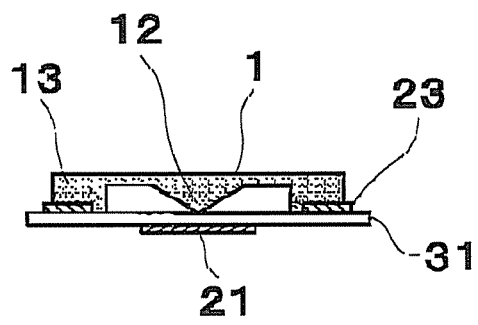
FIGS. 22A, 22B and 22C show a configuration example of a single-axis analog input device.
Figure 22B:
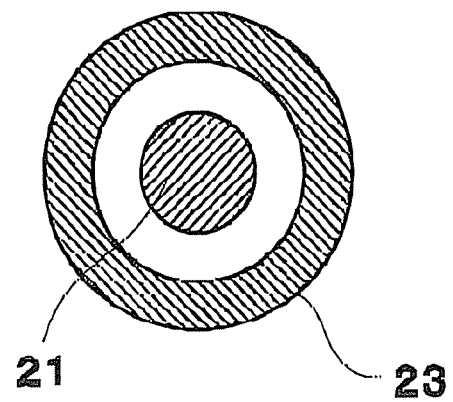
Figure 22C:
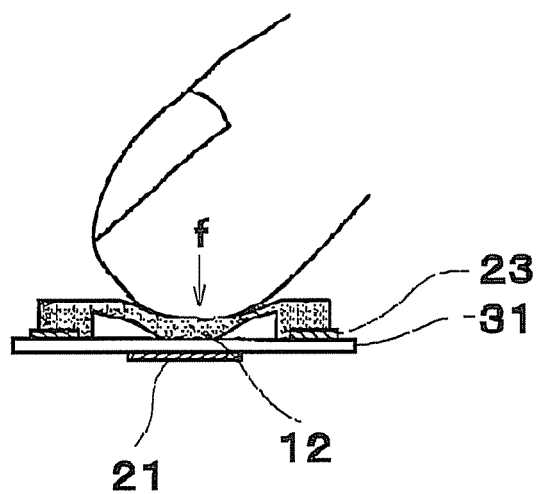

FIGS. 22A, 22B and 22C show a configuration example of a single-axis input device.

A configuration in which both the pressing direction and the pressing force are detected has been described in connection with the first to fifth embodiments. The simplest configuration example according to the invention is described below.

Specifically, the capacitance detection electrode 21 that detects the pressing force is disposed on the back surface of the thin resin film base 31, and the connection section 23 is disposed on the front surface of the thin resin film substrate 31.

The movable electrode 1 that is formed of a conductive rubber is disposed on the front surface of the thin resin film base 31 in order to utilize the thin resin film substrate 31 as an insulating layer.

The movable electrode 1 includes a conically protruding displacement section 12 that gradually slopes away from the capacitance detection electrode 21 toward the periphery of the input device, and a stationary section 13 that is connected to the connection section (GNU).

According to this configuration, when a pressing force f has been applied to the input device (movable electrode 1) using a fingertip or the like, the overlapping area of the displacement section of the movable electrode and the capacitance detection electrode 21 changes due to the pressing force (see FIG. 22C). Therefore, the input device can be used as a single-axis analog input device.

Figure 23A:
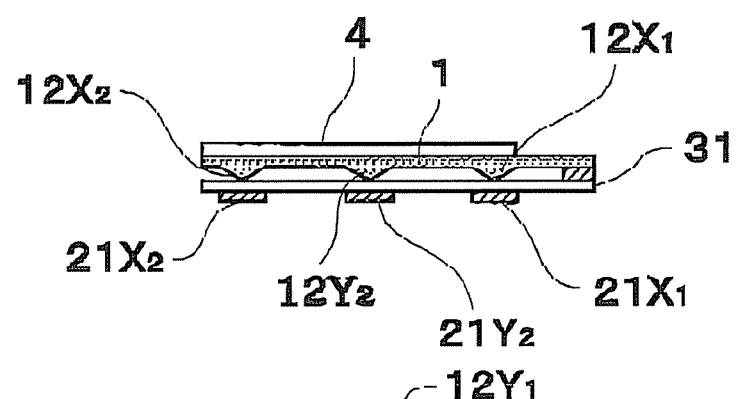
FIGS. 23A and 23B show an example of a pressing direction input device.
Figure 23B:
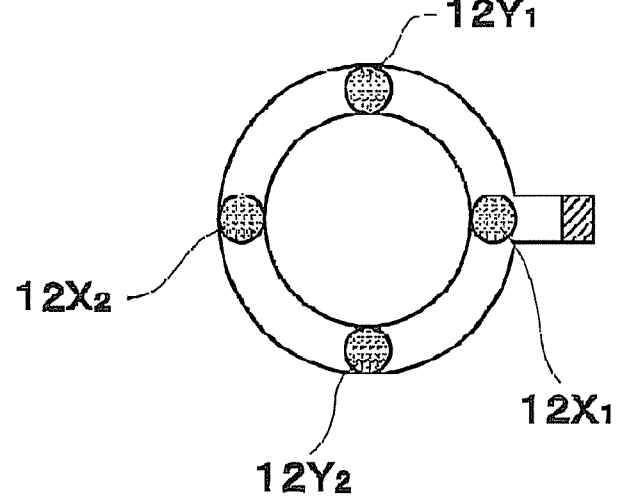

As shown in FIGS. 23A and 23R, the simplest pressing direction input device is obtained by disposing pressing direction-detecting capacitance detection electrodes $21X_1$ and $21X_2$ in the X-axis direction, and disposing pressing direction-detecting capacitance detection electrodes $21Y_1$ and $21Y_2$ in the Y-axis direction on the back surface of the thin resin film base 31, and disposing X-axis direction displacement sections $12X_1$ and $12X_2$ and Y-axis direction displacement sections $12Y_1$ and $12Y_2$ on the front surface of the thin resin film substrate 31 so as to be opposite to the fixed electrode.

A doughnut-shaped operation button 4 is disposed on the movable electrode 1.

Seventh Embodiment

Figure 24A:
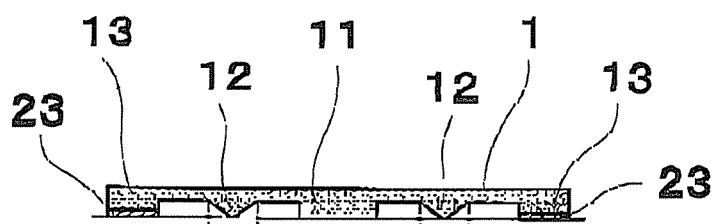
FIGS. 24A and 24B show a configuration example of an input device according to a sixth embodiment of the invention.
Figure 24B:
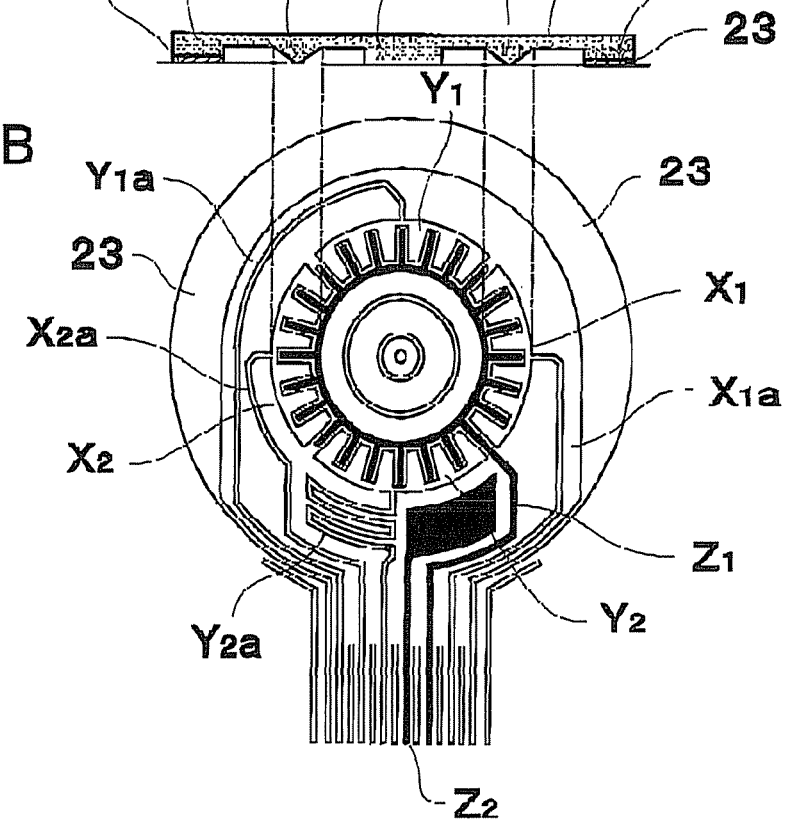

FIGS. 24A and 24B show a configuration example of an input device that is configured so that the pressing direction and the pressing force can be detected by a movable electrode that includes a center stationary section 11, and one displacement section 12 that is formed wound the center stationary section 11 and a ring-shaped concentric protrusion section.

FIG. 24A is a cross-sectional view showing the movable electrode formed of a conductive rubber, and FIG. 21B is a plan view showing a fixed electrode disposed to be opposite to the movable electrode 1.

The center stationary section 11 of the movable electrode 1 corresponds to the center of the capacitance detection section, and includes an approximately concentric gear-shaped electrode $Z_1$, and X-axis direction electrodes $X_1$ and $X_2$ and Y-axis direction electrodes $Y_1$ and $Y_2$ that are disposed around the electrode $Z_1$ to be alternately positioned between the radial electrodes.

Note that $X_{1a}$, $X_{2a}$, $Y_{1a}$, and $Y_{2a}$ indicate a wiring pattern example.

According to this configuration, a thin pressing direction-pressing force detection input device in which the area of the capacitance section is reduced without decreasing the sensitivity can be obtained.

INDUSTRIAL APPLICABILITY

The input device according to the invention may be applied to an electronic instrument that allows input of at least one of the pressing direction and the pressing force, and is required to have a small thickness.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. An input device comprising:
an insulating thin film substrate on which a fixed electrode that includes a capacitance detection electrode, peripheral stationary sections, and a connection section is formed, and a movable electrode formed of a conductive material, the movable electrode including a displacement section that is disposed on a first surface of the thin film substrate opposite to a second surface on which the capacitance detection electrode is formed so as to be opposite to the capacitance detection electrode, and deformed by a pressing force in a direction of the capacitance detection electrode; and
a stationary section that is connected to the connection section of the fixed electrode,
the input device detecting a change in capacitance that occurs when the displacement section has been pressed, and
the thin film substrate functioning as an insulating layer that prevents the displacement section from being electrically connected to the capacitance detection electrode even if the displacement section has been deformed,
wherein the peripheral stationary sections and the connection section of the fixed electrode are disposed on the first surface of thin film substrate.

2. The input device according to claim 1, the movable electrode including a center stationary section, and the displacement section disposed around the center stationary section, the displacement section including a plurality of protrusion sections that protrude toward the capacitance detection electrode, and a distance between an end of a protrusion section among the plurality of protrusion sections and the capacitance detection electrode sequentially increasing toward a periphery of the input device.

3. The input device according to claim 1, wherein the connection section is formed on the first surface of the thin film substrate.

4. The input device according to claim 3, wherein the connection section connected to the stationary section is formed in a shape of a ring.

5. The input device according to claim 3, the thin film substrate further comprising a lead wire section that is formed on the second surface, and the connection section being connected to the lead wire section via a conductive material that is embedded in a hole that is formed through the thin film substrate from the first surface to the second surface.

* * * * *